United States Patent [19]

Dawes et al.

[11] Patent Number: 5,640,293
[45] Date of Patent: Jun. 17, 1997

[54] HIGH-CURRENT, HIGH-VOLTAGE SOLID STATE SWITCH

[75] Inventors: William H. Dawes; Arthur R. Vaughan, both of Manhattan, Kans.

[73] Assignee: Ice Corporation, Manhattan, Kans.

[21] Appl. No.: 149,765

[22] Filed: Nov. 10, 1993

[51] Int. Cl.$^6$ .................................................. H02H 3/00
[52] U.S. Cl. ........................... 361/93; 361/103; 361/57
[58] Field of Search ...................... 361/676, 688, 361/690, 704, 709, 710, 713, 715, 717, 718, 722, 18, 42, 87, 93, 103, 100, 101, 57, 58

[56] References Cited

U.S. PATENT DOCUMENTS 3,876,926  4/1975  Schott et al. ............................ 361/705
4,937,697  6/1990  Edwards et al. ......................... 361/18
4,955,069  9/1990  Ionescu ................................... 361/93
5,119,265  6/1992  Qualich et al. .......................... 361/103
5,231,308  7/1993  Fisch ...................................... 361/816
5,351,162  9/1994  Koishikawa ............................ 361/18

Primary Examiner—Jeffrey A. Gaffin
Assistant Examiner—Ronald W. Leja
Attorney, Agent, or Firm—Hovey, Williams, Timmons & Collins

[57] ABSTRACT

A high-current, high-voltage solid state switch includes at least one solid state switching component connected to control circuitry configured into a single package. In the preferred embodiment, the switching component includes a power field effect transistor, and the control circuitry includes control logic, temperature sense and overcurrent circuits supported in an adjacent, coplanar relationship. Parallel coupled transistors are used for higher current embodiments.

18 Claims, 4 Drawing Sheets

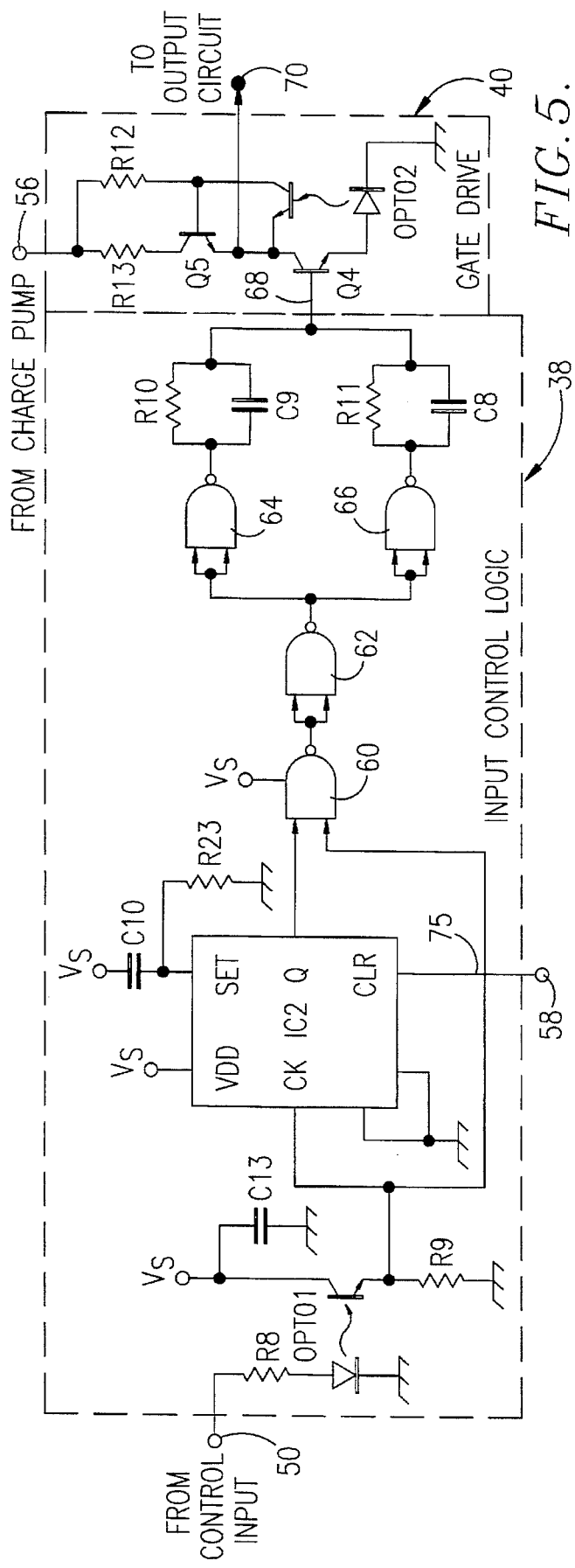
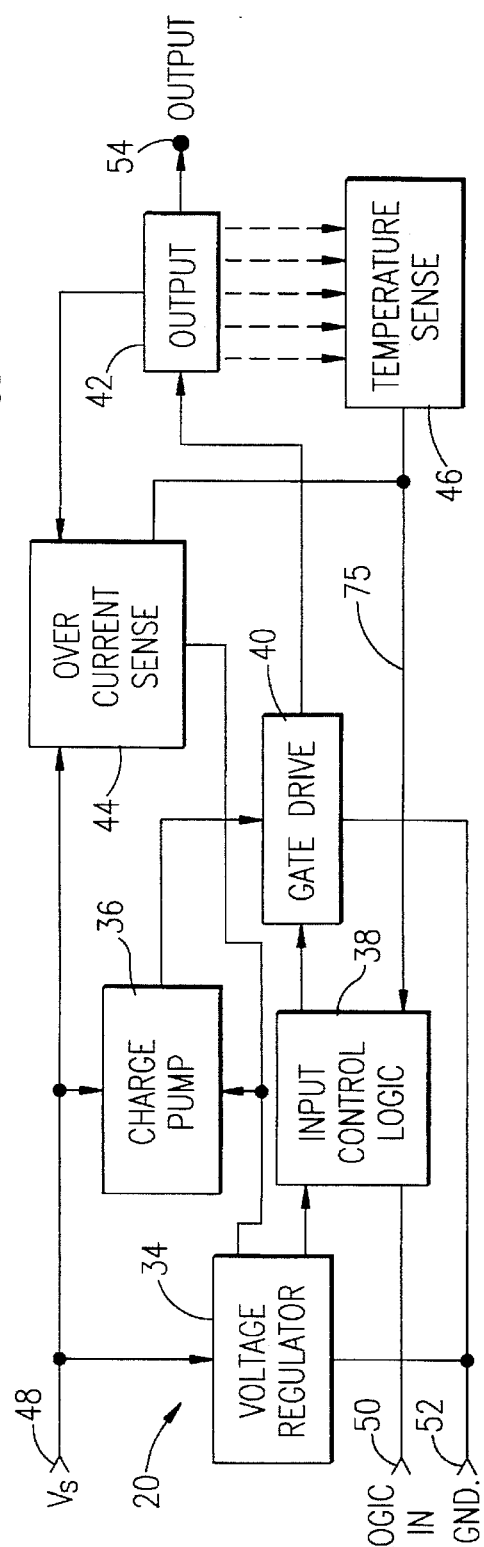
FIG. 5.
FIG. 3.

HIGH-CURRENT, HIGH-VOLTAGE SOLID STATE SWITCH

BACKGROUND OF THE INVENTION

1. Field of the Invention

The present invention relates to the field of solid state power switching devices. More particularly, the invention concerns a high-current, high-voltage solid state switch having at least one solid state switching component connected to control circuitry configured into a single package.

2. Description of the Prior Art

In the prior art, solid state switching devices such as power field effect transistors (FETs) have been used for switching high-voltage, high-current loads. As those skilled in the art appreciate, however, such high power applications place the switching devices at risk of damage due to overcurrent, high temperature, or both.

Prior art packages of solid state switches have required connection to separate control logic circuitry and overcurrent circuitry if such protection is desired. Additionally, effective temperature protection has not been available. As a result, practical high-voltage, high-current have not been available.

SUMMARY OF THE INVENTION

The present invention solves the prior art problems mentioned above and provides a distinct advance in the state of the art. More particularly, the switch apparatus hereof provides switching components and control circuitry in a single package.

The preferred embodiment of the present invention includes at least one solid state switching device connected to an adjacent control circuit and support structure forming the apparatus into a single package. More particularly, the preferred switching device includes at least one power field effect transistor and the control circuit includes control logic, temperature sense circuitry and overcurrent circuitry. In preferred forms, the support structure includes a base plate supporting the switching device and control circuit in a coplanar arrangement, with the distances between the control circuit and the current and temperature sensors limited to minimize sensor $I^2R$ losses and induced noise.

BRIEF DESCRIPTION OF THE DRAWINGS

FIG. 3 is an electrical block diagram of the electrical circuit of FIGS. 1 and 2;

FIG. 5 is an electrical schematic diagram of the control logic and gate drive circuits of FIG. 3.

DETAILED DESCRIPTION OF THE PREFERRED EMBODIMENTS

Figure 1:
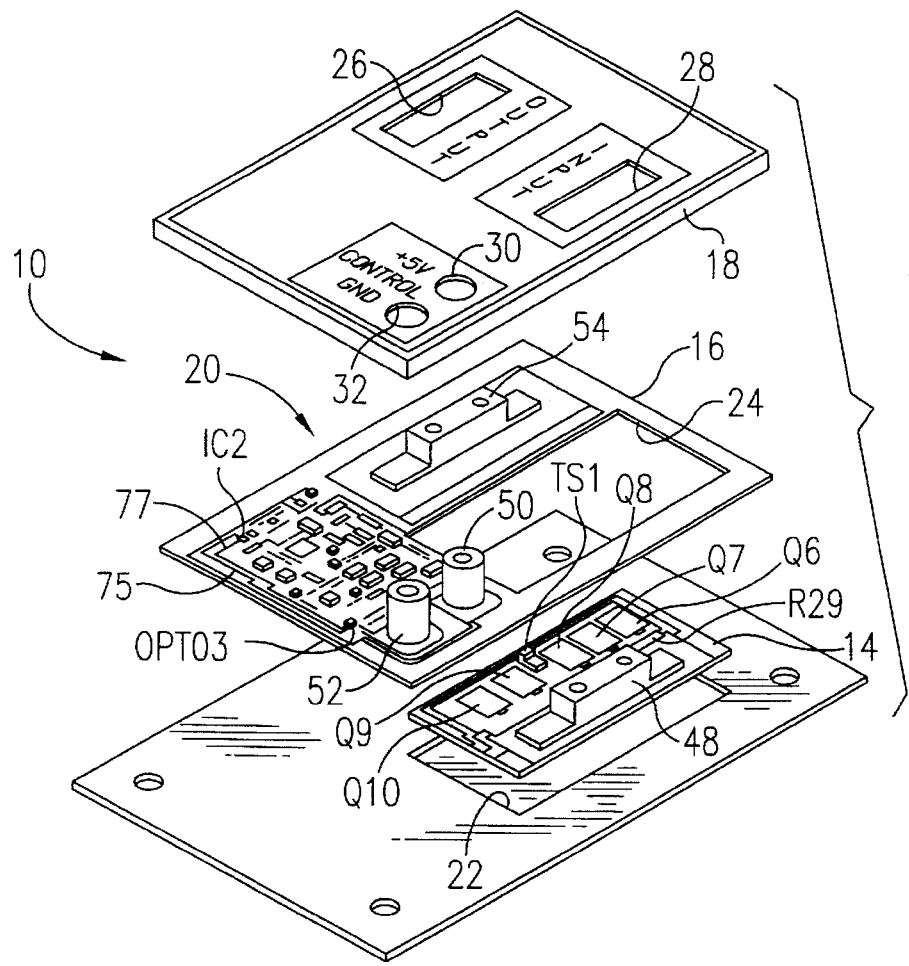
FIG. 1 is an exploded isometric view of the preferred apparatus of the present invention.

FIG. 1 presents an exploded view of the 400 volt, 100 ampere switch apparatus 10 of the present invention, which includes base plate 12, switch substrate 14, circuit substrate 16, and cover plate 18. Additionally, apparatus 10 includes control circuit 20 with the components thereof mounted on substrates 14 and 16.

Preferred base plate 12 is composed of tin plated KOVAR with recess 22 defined in the upper face thereof and configured for receiving switch substrate 14 therein. By supporting substrate 14 in recess 22, base plate 12 presents reduced thickness in this area to shorten the heat path for improved thermal transfer from switch substrate 14 to an external heat sink (not shown) to which base plate 12 is preferably mounted.

Switch substrate 14 electrically isolates the components of circuit 20 supported thereon from base plate 12. Substrate 14 is preferably composed of aluminum nitride, selected for its high thermal conductive properties, metalized on its lower face and soldered into recess 22.

Circuit substrate 16 is preferably composed of aluminum oxide (alumina $Al_2O_3$) and is formed to present window 24 through which switch substrate 14 and the electrical components thereon are accessible. Substrate 16 is attached to base plate 12 through epoxy or soldering, for example. As assembled, substrates 14,16 and the electrical components of circuit 20 are substantially coplanar and base plate 12 is substantially coextensive with substrates 14 an 16 and the circuitry thereon. In this way, these components cooperate to present means forming apparatus 10 into a single package.

Ceramic cover plate 18 is configured to enclose and protect substrates 14, 16 and circuit 20. Cover plate 18 includes output terminal opening 26, input terminal opening 28, control signal terminal opening 30 and ground terminal opening 32.

Control Circuit 20

FIG. 3 illustrates control circuit 20 in a block diagram format. This embodiment is designed to operate at 400 volts and switch 100 amperes. Circuit 20 includes voltage regulator circuit 34, charge pump circuit 36, input control logic circuit 38, gate drive circuit 40, output circuit 42, overcurrent circuit 44 and temperature sense circuit 46. Terminals 48, 50, 52 and 54 provide respective connections to externally connected supply voltage, input TTL logic signal, circuit ground, and output load.

The conductors and resistors of circuit 20 are preferably fabricated as thick-film hybrid circuits made by screen printing the conductors and resistors on ceramic substrates 14,16. Gold paste is preferred for the majority of the conductors but paladium silver is preferred for the large output terminal and control input conductor pads. Resistors of circuit 20 are constructed of appropriate resistor pastes available from Cermalloy.

After firing to bond the conductor and resistor pastes, other components such as capacitors, transistors, integrated circuits, and terminals are attached to complete the circuit. After placement of the surface components, wire bonding was used with 1 mil gold wire to complete the wire bonds of all of the ertectically attached semiconductors. As discussed further herein, most of the components of circuit 20 are supported on circuit substrate 16 with switch substrate 14 supporting five power field effect transistors, a temperature sensor and a thick-film current sensing resistor. Wires are bonded in place to interconnect the conductors between substrates 14 and 16.

Voltage Regulator Circuit 34

Figure 4:
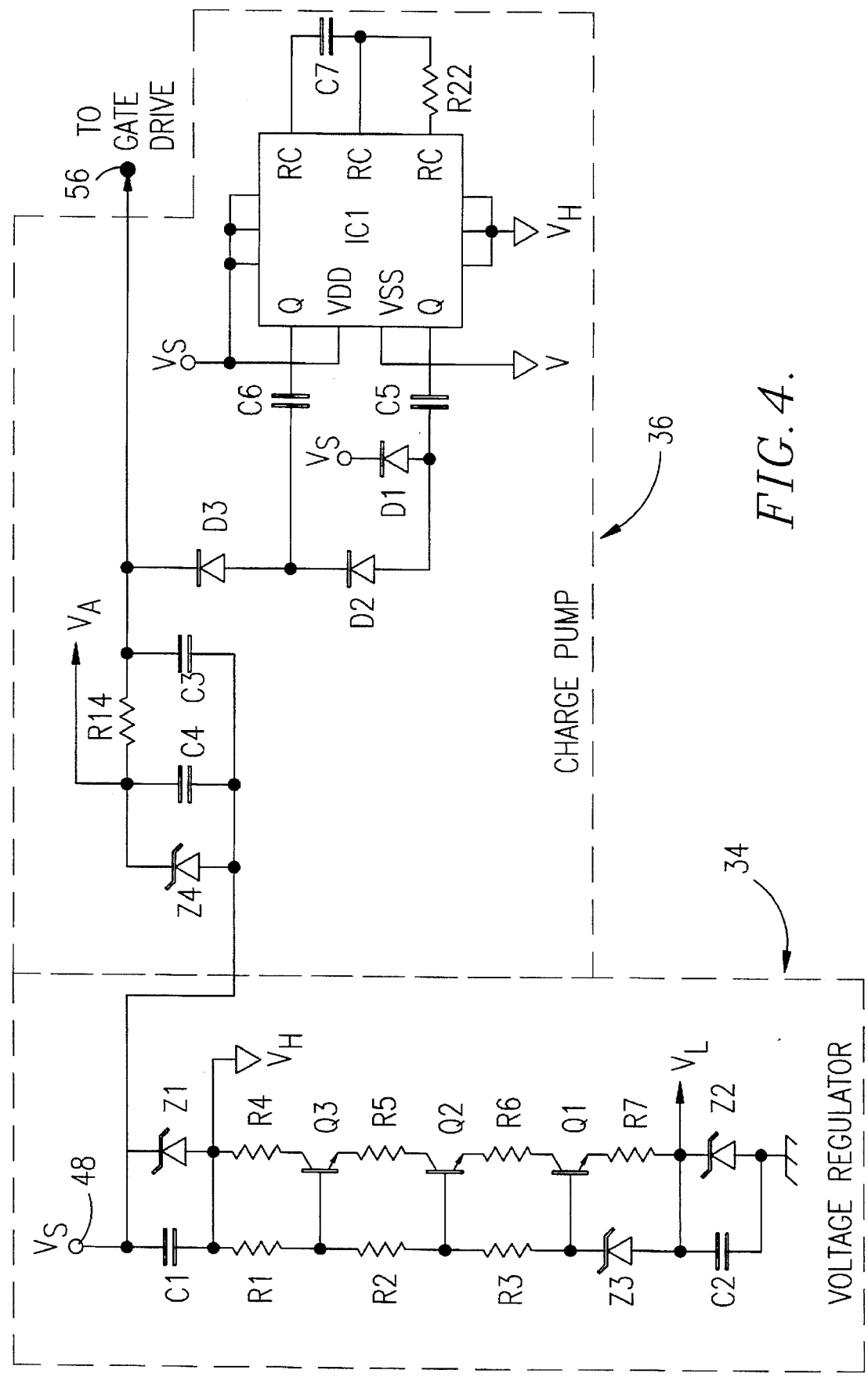
FIG. 4 is an electrical schematic diagram of the voltage regulator and charge pump circuits of FIG. 3.

FIG. 4 presents electrical schematic diagrams of voltage regulator circuit 34 and charge pump circuit 36. Regulator circuit 34 presents a modified voltage divider network designed to provide a high level ground reference (VH) at 14 volts below supply voltage (VS) and a low level supply voltage (VL) at 12 volts above circuit ground. Circuit 34 includes capacitor C1, resistors R1, R2 and R3, zener diode Z3 and capacitor C2 all connected in series as shown in FIG. 4 to form one side of the ladder network. The other side of the ladder is formed by the series connected components of zener diode Z1, resistor R4, transistor Q3, resistor R5, transistor Q2, resistor R6, transistor Q1, resistor R7 and zener diode Z2. The respective sides of the ladder are connected in parallel as illustrated with the anode of zener diode Z1 providing VH at a nominal 386 volts (14 volts below nominal supply at 400 volts). Low level supply voltage VL is provided at the cathode of zener diode Z2.

On power-up, current flow through zener diode Z1 and resistor R1 turns on transistor Q3, current flow through resistor R2 turns on transistor Q2, and current flow through resistor R3 turns on transistor Q1. With transistors Q3, Q2 and Q1 conducting, the voltage divider network is then defined by resistors R4, R5, R6 and R7. Transistors Q1, Q2 and Q3 operate as constant current sources for both zener diodes Z2 and Z3 because the voltage across resistor R7 is maintained at a constant potential by zener diode Z3. Capacitors C1 and C2 operate as bypass capacitors to suppress diode noise and the noise generated by logic switching.

Charge Pump Circuit 36

Charge pump circuit 36 is needed to provide a voltage above VS to supply a gate voltage high enough to cause saturation of the field effect transistors used in output circuit 42. Circuit 36 includes astable oscillator IC1. The frequency of oscillation is determined by the RC combination of C7 and R22. The output from oscillator IC1 is in the form of a square wave at outputs Q and $\bar{Q}$, which are 180° out of phase. With $\bar{Q}$ low, C5 charges through D1 to 14 volts (which is the difference between VS and VH). At the same time, Q is high and capacitor C6 cannot charge through diode D2. When $\bar{Q}$ goes high and Q goes low, the junction of diode D1 and capacitor C5 is at 14 volts above VS. Diode D1 is thereby reverse biased, but the charge on capacitor C5 charges capacitor C6.

When $\bar{Q}$ returns low, C5 is again charged by way of diode D1, but the charge on capacitor C6 remains above VS and is prevented from discharging by diode D2. As a result, the charge on capacitor C6 is raised to 28 volts and when Q is high, the junction of diodes D2 and D3 and capacitor C6 is raised 28 volts above VS. This also tends to charge capacitors C3 and C4 to the same voltage but zener diode Z4 regulates this voltage to 14 volts with current limiting provided by R11. Thus, the junction between resistor R14 and C3 provides an output to terminal 56 at 14 volts above VS (nominal 414 volts). This is supplied to gate drive circuit 40. Additionally, the junction of resistor R14 and capacitor C4 provides a voltage VA at this same level to supply the comparators of overcurrent and temperature sense circuits 44 and 46.

Input Control Logic Circuit 38

FIG. 5 presents electrical schematic diagrams of input control logic circuit 38 and gate drive circuit 40. Input control logic circuit 38 receives a conventional TTL input logic signal at +5 VDC by way of terminal 50. This activates the light emitting diode of OPT01 by way of resistor RS. This provision electrically isolates circuit 20 and thereby apparatus 10 from the control signal source in order to prevent damage in the event of catastrophic failure due to the high currents and voltages being switched. With the light emitting diode activated, the transistor portion of OPT01 becomes is saturated by way of VL (+12 VDC) connected to the collector. Capacitor 13 is also connected to the collector for voltage smoothing and noise suppression.

The emitter is connected by way of Resistor R9 to ground and as input to the clock terminal CK of flip-flop IC2. Terminals K and VSS are connected to circuit ground and terminal VDD is connected to supply voltage VS. Supply voltage is also connected to terminal SET by way of capacitor C10 and to circuit ground by way of resistor R23. Clear terminal CLR is connected to terminal 58 for receiving reset signals from overcurrent circuit 44 and temperature sense circuit 46 as explained further herein.

The rising edge of the input voltage signal to terminal CK clocks through a logic high signal to terminal Q, which is connected to one input of NAND gate 60. This same input voltage signal is also connected to the other input terminal of NAND 60. With both inputs high, the output from NAND 60 goes low to both inputs of NAND gate 62, connected as an inverter as illustrated. The output from NAND 62 is logic high and is provided to the inputs of NAND gates 64 and 66, also connected as inverters. The logic low output from NAND 64 is provided to parallel connected resistor R10 and capacitor C9. Similarly, the logic low output from NAND 66 is provided to parallel resistor R11 and capacitor C8. This arrangement of NAND gates 60–66 is provided to ensure sufficient output capacity of the logic high signal from circuit 38 on line 68 to gate drive circuit 40. Thus, an input control signal at terminal 50 results in a logic low output signal on line 68.

Gate Drive Circuit 40

FIG. 5 also illustrates gate drive circuit 40 which receives input from circuit 38 by way of line 68 at the base of transistor Q4. Terminal 56 receives supply voltage at 14 volts above VS from charge pump circuit 36. With no logic high input signal from circuit 38, the base of transistor Q5 receives base current from terminal 56 by way of resistor R12. This activates transistor Q5 and supply voltage is supplied to the collector by way of resistor R13. The emitter of transistor Q5 is connected to terminal 70, which supplies control voltage to output circuit 42.

With no input control signal at input terminal 50, line 68 is at logic high to the base of transistor Q4. This turns on transistor Q4 which conducts from the emitter of transistor Q5 through the light emitting diode of OPT02 to circuit ground, thus turning off transistor Q5. The transistor portion of OPT02 then turns on and conducts to latch itself in this state through transistor Q4. Because transistor Q4 is conducting, no voltage signal is present on terminal 70 and output circuit 42 is off.

When a logic high input signal is received at terminal 50, the output from circuit 38 goes low at line 68, which turns off transistor Q4 and OPT02. This allows the voltage on terminal 70 to rise to the charge pump voltage at a nominal 414 volts (14 volts over VS at 400 volts) to provide active pull-up of the FETs in output circuit 42.

When a logic low input signal is received at terminal 50, the output from circuit 38 on line 68 goes high and turns on transistor Q4. Transistor Q4 then conducts through the LED of OPT02 to circuit ground which in turn turns on the transistor of OPT02 and turns off transistor Q5. This action not only removes the charge pump voltage from terminal 70, but also imposes circuit ground potential on terminal 70 for active pull-down of the FETs of output circuit 42.

Output Circuit 42

Figure 6:
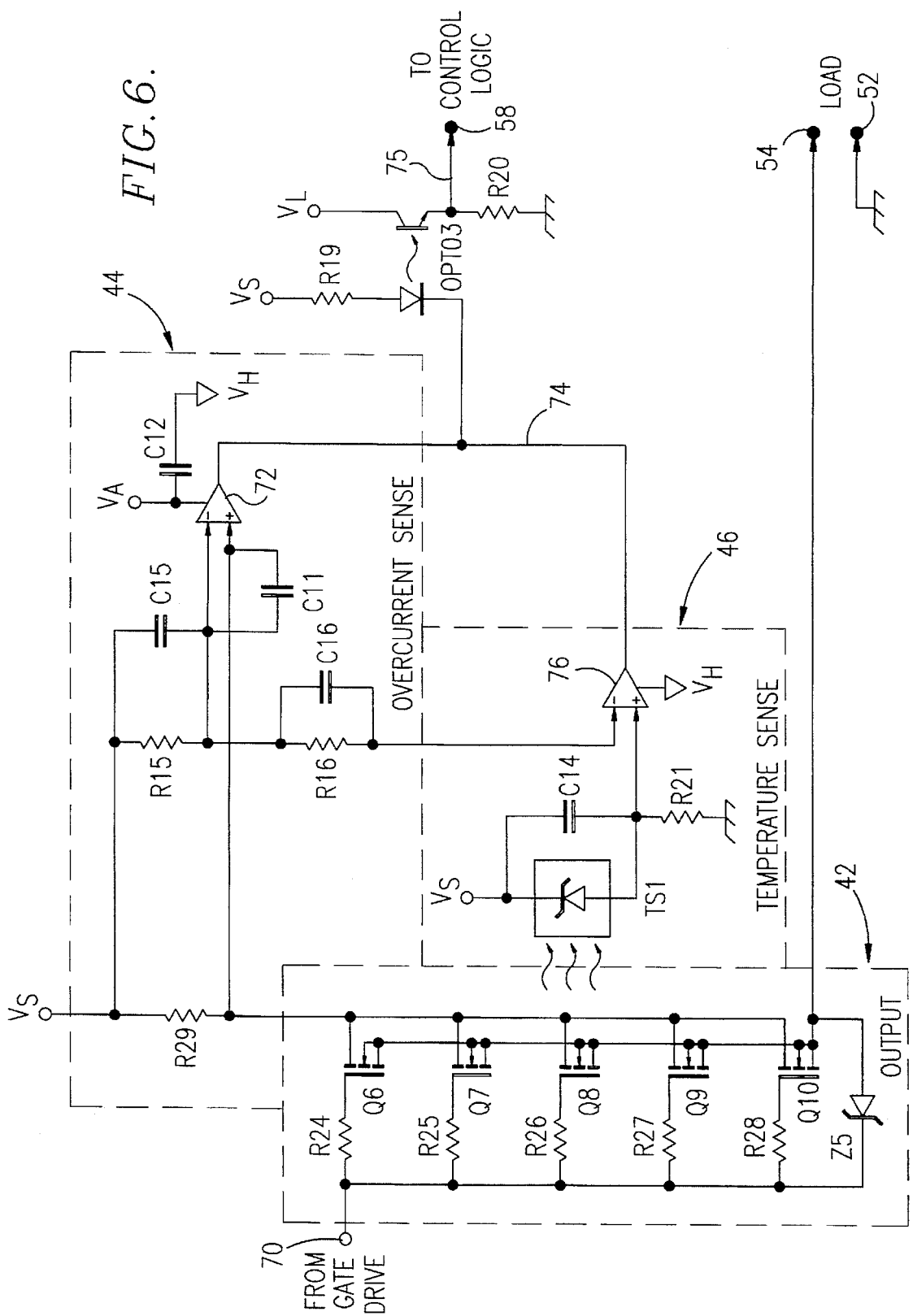
FIG. 6 is an electrical schematic diagram of the output, overcurrent sense and temperature sense circuits of FIG. 3.

FIG. 6 illustrates output circuit 42, overcurrent circuit 44 and temperature sense circuit 46. Output circuit 42 as illustrated is configured to switch up to 100 amperes at 400 volts. This is accomplished by connecting field effect transistors (FETs) Q6, Q7, Q8, Q9 and Q10 in parallel with each for carrying about 20 amperes of the total load. Each source terminal of FETs Q6–10 is connected to voltage supply VS by way of resistor R29, and each drain is connected to output terminal 54. With this arrangement, output circuit 42 operates as a high side switch of terminal 54 with circuit ground being supplied to the load at terminal 52.

Gate voltage is provided from gate drive circuit 40 at terminal 70. Resistors R24, R25, R26, R27 and R28 are coupled between terminal 70 and the respective gates of FETs Q6–10 to eliminate FET oscillations. Zener diode Z5 interconnects the drains of FETs Q6–10 with the gate inputs in order to limit the gate-drain voltage difference to 12 volts to prevent transistor damage. A gate drive signal at terminal 72 turns on FETs Q6–10 and energizes the load connected to terminals 52 and 54. As illustrated in FIG. 1, FETs Q6–10 are mounted to switch substrate 14.

As discussed above, the charge pump gate voltage supplied to FETs Q6–10 from gate drive circuit 40 provides active pull-up in 20 microseconds at 100 amperes and even faster pull-up at the lower currents. The imposition of circuit ground potential provides active pull-down in 0.5 microseconds (500 ns.). Because of this rapid switching of FETs Q6–10, the utility of the present invention is enhanced allowing such uses as aircraft electrical switching at 400 Hz. Furthermore, power dissipation is minimized during transitions.

It will also be appreciated that output circuit 42 provides for load side switching in contrast to ground side switching commonly used in the prior art. This provision allows the use of a single line to the load with return being provided by common ground and provides a safer environment at the load because the supply line is de-energized when the output circuit 24 is turned off.

Overcurrent Circuit 44

Resistor R29 is connected in series with FETs Q6–10 and operates as a current-to-voltage converter presenting a low resistance, high power construction. Resistor R29 (1.0 milliohms) is composed of series 400 resistor paste available from Cermalloy or equivalent and presents the configuration of an elongated rectangle positioned on switch substrate 14 between FETs Q6–10 and input power supply terminal 48.

As will be appreciated, the voltage signal from resistor R29 is in the range of a few millivolts. With such a low voltage, it is important that this signal be received and processed before any significant degradation occurs. The configuration of apparatus 10 as a single package allows placement of the Kelvin leads within the switch package. This eliminates electrical noise that would be associated with the use of an external sense resistor.

The voltage drop across resistor R29 provides a voltage signal to comparator 72 corresponding to the current flow at about 0.1 mv. per ampere. Specifically, the supply voltage side of resistor R29 is connected to the negative input terminal of comparator 72 by way of parallel connected resistor R15 and capacitor C15. Resistor R15 is also connected in series with resistor R16 to provide a reference voltage to the positive input terminal of comparator 72.

The load side of resistor R29 is connected to the positive input terminal of comparator 72. Supply voltage to comparator 72 is provided as voltage VA supplied by charge pump circuit 36 at about 14 volts over VS. Capacitor C11 interconnects the input terminals of comparator 72 and capacitor C12 provides current surge protection when the comparator voltage supply comes on.

When the current through resistor R29 exceeds the predetermined level as defined by resistors R15 and R16, the output from comparator 72 goes low on line 74 and sinks current through the light emitting diode of OPT03 and resistor R19. This activates the transistor of OPT03 to conduct and provide a fault logic signal (VL) to terminal 58 on line 75, connected to terminal CLR of IC2 in circuit 38 (see FIG. 5), which causes the control input to be overridden to turn off the FETs.

When normal load currents are not exceeded through resistor R29, the output from comparator 72 is at a logic high state at charge pump voltage level VA, which is above supply voltage VS, turning off level shifter OPT03. Pull-down resistor R20 is connected to circuit ground and to the emitter of the transistor of OPT03 to pull down the voltage on line 75 and terminal 58 to logic low when the output from comparator 72 is logic low.

As discussed above, line 75 is connected by way of terminal 58 to terminal CLR of IC2 (FIG. 5). A logic high signal on line 75 clears IC2 which results in a logic low signal at terminal Q thereof. This produces a logic low signal on line 68 which in turn shuts off the gate drive to FETs Q6–10. It will be noted that IC2 operates as a "fault latch" whenever an input signal is received at terminal CLR. That is to say, when such a signal is received, the output at Q2 remains at logic low which keeps FETs Q6–10 turned off until the input signal at terminal 50 is turned off and then back on.

Temperature Sense Circuit 46

Temperature sense circuit 46 includes temperature sensor TS1 (type LM135) similar to a zener diode whose device voltage varies 10 mv. per degree Celsius. For example, and noting that 100° C. equals 373K, a trip temperature at 100° C. results in a device voltage (TS1) of 3.73 volts. As illustrated in FIG. 1, sensor TS1 is mounted to switch substrate 14 between FETs Q8 and Q9. In this position, sensor TS1 effectively monitors the temperature of substrate 14 which in turn represents the temperature of FETs Q6–10 as a group. Substrate 14 operates as a thermal transmission medium which tends to level the temperature among FETs Q6–10.

The tendency is well known for parallel-connected FETs to share current and, with substrate 14 being a good thermal conductor, the thermal load among FETs Q6–10 is distributed evenly. This helps ensure that the respective FET temperatures remain substantially equal and that the FETs carry substantially equal current loads. Furthermore, the temperature leveling effect means that the temperature of substrate 14 represents the temperature of FETs Q6–10. By mounting sensor TS1 to substrate 14 adjacent the FETs, sensor TS1 is thermally coupled with and effectively monitors the temperature of FETs Q6–10.

The cathode of sensor TS1 is coupled with supply voltage VS and to one side of capacitor C14. The anode of sensor TS1 is connected to the other side of capacitor C14, to circuit grounded, pull-down resistor R21, and to the positive input terminal of comparator 76. The negative input terminal of comparator 76 is coupled to parallel connected resistor R16 and capacitor C16. As mentioned above, resistors R15 and R16 provide the respective reference voltages to comparators 72 and 76. The output from comparator 76 is connected line 74 and operates in parallel with comparator 72 as a "wire-ORed" output.

If the temperature of FETs Q6–10 exceeds the predetermined temperature as defined by the voltage reference to comparator 76, the output therefrom goes low on line 74 to sink current. This results in a logic high signal on terminal 58 and line 75, which clears IC2 and turns off FETs Q6–10.

With reference to FIG. 1, current flow through apparatus 10 is conducted from input terminal 48, through FETs Q6–10 to output terminal 54. This flow of current results in a surrounding magnetic field according to the right hand rule, with a portion of this magnetic field passing through circuit 20. When circuit 20 is energized, the initial current surge causes in a rapid rise in the strength of the resulting magnetic field and with this changing magnetic field, transient current spikes can be induced in the various conductors. If such a current spike were to be induced in fault line 75, IC2 would be cleared and turn off FETs Q6–10. This problem would be particularly acute at higher current flows.

In order to prevent this problem, fault line 75 is routed closely adjacent circuit ground line 77 so that no substantial area is presented between these two lines. This configuration prevents the occurrence of a current spike or transient in line 75, thereby avoiding a false trip simulating an overcurrent or high temperature fault.

Second Embodiment

Figure 2:
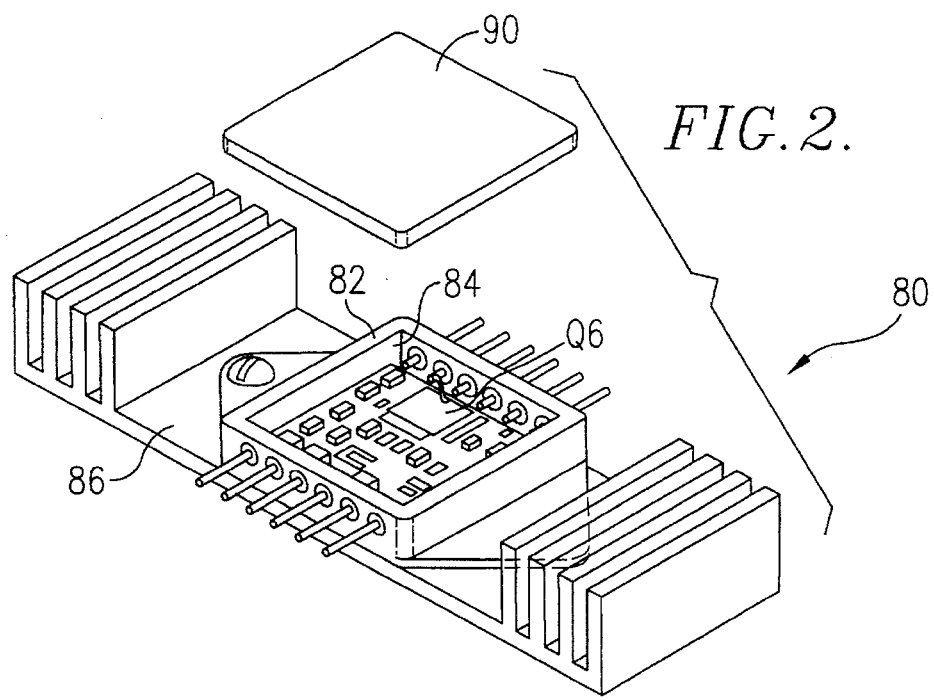
FIG. 2 is an exploded isometric view of another embodiment of the present invention.

FIG. 2 illustrates apparatus 80 which is the five ampere embodiment of the present invention and which is similar to apparatus 10 except for the package and the fact that only one FET is used. More particularly, apparatus 80 includes housing 82 (available from Airpax as part number 200B2645) presenting recess 84 and mounted to external heat sink 86, substrate 88 (alumina $Al_2O_3$) with control circuit 20 including single FET Q6 mounted thereon and received within recess 84, and cover 90. With cover 90 in place, apparatus 80 is hermetically sealed and mounted to heat sink 86. As with apparatus 10, apparatus 80 includes a base plate as part of housing 82 supporting substrate 88. This base plate is substantially coextensive with circuit 20, and supports circuit 20 in a manner substantially coplanar with the switching components (FET Q6).

Circuit 92 is another embodiment of control circuit 20 showing those portions changed to accomodate a different type of voltage regulator 94 and gate drive 96. Additionally, only one load transistor Q6 is shown, it being understood that additional load transistors can be coupled in parallel in the manner of output circuit 42. It will also be noted that transistor Q6 is in series ahead of sense resistor R29 in contrast to the arrangement of output circuit 42 (FIG. 6).

With transistor Q6 initially off, line 98 between transistor Q6 and resistor R29 is de-energized. Supply voltage Vs is provided to one side of resistor R30 which is connected in series with zener diode Z6 for voltage limiting at about 12 volts. The cathode of diode Z6 is coupled with the gate of transistor Q12. Supply voltage Vs is also provided to the drain of transistor Q12, which is coupled in series with capacitor C17.

Assuming a supply voltage above 12 volts, zener diode Z6 supplies gate voltage to transistor Q12 which turns on to provide supply power through diode D4 to terminal 100.

Diode Z6 limits the gate voltage of transistor Q12 to 12 volts, which also limits the source voltage of transistor Q12 to 12 volts. Terminal 100 provides supply voltage at 12 volts to input control logic circuit 38, overcurrent sense circuit 44, temperature sense circuit 46 and other components where needed. With transistor Q6 turned off and line 98 de-energized, charge pump 36 and gate drive 96 are also de-energized thereby reducing the power supply consumption when transistor Q6 is off.

When input control logic circuit 38 is activated to energize the load, a logic low output signal is provided on line 68 to inverter 102, which in turn provides a logic high signal to the base of transistor Q14 (NPN) and to the base of transistor Q15 (PNP). With this input, transistor Q14 turns on to supply voltage through resistor R24 to the gate of load transistor Q6, which turn on. With transistor Q6 conducting, the load is energized through line 98 and current sense resistor R29. With line 98 energized at supply voltage Vs, the collector of transistor Q15 rises to the supply voltage level and turns off.

Line 98 also provides supply voltage to zener diode Z7 connected in series with resistor R31. As the supply voltage rises, diode Z7 begins to conduct to supply voltage at about 12–14 volts from the anode thereof to the gate of transistor Q13, which turns on. As illulstrated, capacitor C18 and diode D5 are connected in series with transistor Q13.

With transistor Q13 on, the voltage across capacitor C18 rises to the same level as the drop across diode Z7 (about 12–14 volts). When this occurs, voltage is supplied from the junction between capacitor C18 and diode D5 to activate charge pump 36 (also connected to line 98 for supply voltage). Charge pump 36 provides its output through diode D3 to the juncture represented by terminal 100. Capacitor C3 couples the cathode of diode D3 with line 98. The charge pump output through diode D3 is 12 volts higher than supply voltage Vs and this maintains the voltage at terminal 100 at 12 volts above Vs. Thus, transistor Q14 stays on. As will now be appreciated, line 98 operates as a floating control circuit ground in circuit 92.

When the input on line 68 goes logic high, transistor Q14 turns off which turns off load transistor Q6. This de-energizes the load and line 98 is pulled down to ground level voltage through the load. When this occurs, charge pump 36 is de-energized and transistor Q15 turns on, which pulls down the gate of transistor Q6 to the ground level on line 98. Supply voltage for the control circuitry continues through terminal 100.

From the description above, those skilled in the art will appreciate the significant advance provided by the present invention. More particularly, high power switching components and associated control circuitry are mounted in a single package with input control, overcurrent and temperature sense circuitry included.

It will also be appreciated that the present invention encompasses many variations in the preferred embodiments described herein. Having thus described the preferred embodiments of the present invention, the following is claimed as new and desired to be secured by Letters Patent:

1. An electrical switching apparatus comprising:
   solid state switch means operable for selectively switching electrical current flow relative to the supply side of a load with the other side of the load being coupled with circuit ground; and
   control circuit means electrically coupled with said switch means for controlling the operation thereof,
   said switch means including a field effect transistor switchable between a conducting state and a nonconducting state, said control circuit means including means for applying a gate voltage to said field effect transistor for switching thereof to said conducting state and means for rapidly coupling said circuit ground with the gate of said transistor for switching thereof from said conducting state to said nonconducting state in about 0.5 microseconds in order to prevent excessive power dissipation through said transistor during the transition from said conducting state to said nonconducting state.

2. The apparatus as set forth in claim 1, further including support means in the nature of a substrate supporting said switch means and said circuit means in an adjacent relationship with said switch means and circuit means together being substantially congruent with said support means, and further including means electrically isolating said switch means and said circuit means from one another and means thermally coupling said switch means and said circuit means with said support means.

3. The apparatus as set forth in claim 1, said switch means including a plurality of parallel coupled field effect transistors.

4. The apparatus as set forth in claim 1, said control circuit including an overcurrent sense circuit having means for switching off said switch means in the event of excessive current flow.

5. The apparatus as set forth in claim 1, said control circuit including a temperature sensor positioned adjacent said switch means and coupled in a thermal relationship therewith for sensing the temperature thereof and including means for producing a voltage signal representative of said switch means temperature, said control circuit further including a temperature sense circuit electrically coupled with said temperature sensor and responsive to said voltage signal for switching off said switch means in the event of a predetermined excessive temperature thereof.

6. The apparatus as set forth in claim 1, said control circuit means including a charge pump for providing a control signal to said switch means at a voltage higher than supply voltage supplied to said circuit means.

7. The apparatus as set forth in claim 1, said circuit means including fault sensing means for sensing a fault in the operation of said apparatus and for producing a fault signal on a fault line representative of a fault, and fault responsive means responsive to said fault signal on said fault line for switching off said current flow, said current flow producing a changing magnetic field when said switch means is switching on said current flow and said fault line being subject to inducement of a transient signal in response to said changing magnetic field, said circuit means further including a circuit ground line positioned closely adjacent said fault line for minimizing said transient signal sufficiently to prevent a transient reduced fault signal.

8. The apparatus as set forth in claim 1, said switch means including means for switching at least five amperes of current at 400 volts.

9. The apparatus as set forth in claim 8, said switch means including means for switching 100 amperes of current at 400 volts.

10. The apparatus as set forth in claim 9, said switch means and control circuit means cooperatively presenting means for switching on said 100 amperes of current in about 20 microseconds.

11. The apparatus as set forth in claim 10, said switch means and control circuit means cooperatively presenting means for switching off said 100 amperes of current in about one-half microsecond.

12. The apparatus as set forth in claim 8, said switch means and control circuit means cooperatively presenting means for switching on said current in less than about 20 microseconds.

13. An electrical switching apparatus comprising:

solid state switch means operable for selectively switching electrical current flow relative to the supply side of a load with the other side of the load being coupled with circuit ground; and control circuit means electrically coupled with said switch means for controlling the operation thereof, fault sensing means for sensing a fault in the operation of said apparatus and for producing a fault signal on a fault line representative of a fault, and fault responsive means responsive to said fault signal on said fault line for switching off said current flow, said current flow producing a changing magnetic field when said switch means is switching on said current flow and said fault line being subject to inducement of a transient signal in response to said changing magnetic field, said circuit means further including a circuit ground line positioned closely adjacent said fault line for minimizing said transient signal sufficiently to prevent a transient induced fault signal.

14. The apparatus as set forth in claim 13, said switch means including a field effect transistor.

15. The apparatus as set forth in claim 13, said switch means including a plurality of parallel-coupled field effect transistors.

16. The apparatus as set forth in claim 13, said circuit means including means for sensing an overcurrent condition through said switch means and responsive to said condition turning off said switch means.

17. The apparatus as set forth in claim 13, said circuit means including means for sensing an over temperature condition of said switch means and responsive to said condition turning off said switch means.

18. The apparatus as set forth in claim 13, said switch means including a field effect transistor switchable between a conducting state and a nonconducting state, said control circuit means including means for applying a gate voltage to said field effect transistor for switching thereof to said conducting state and means for rapidly coupling said circuit ground with the gate of said transistor for switching thereof from said conducting state to said nonconducting state in about 0.5 microseconds in order to prevent excessive power dissipation through said transistor during the transition from said conducting state to said nonconducting state.

* * * * *